United States Patent
Letty et al.

(10) Patent No.: US 11,077,469 B2
(45) Date of Patent: Aug. 3, 2021

(54) METHOD FOR SORTING SILICON WAFERS ACCORDING TO THEIR BULK LIFETIME

(71) Applicant: COMMISSARIAT A L'ENERGIE ATOMIQUE ET AUX ENERGIES ALTERNATIVES, Paris (FR)

(72) Inventors: Elénore Letty, Bourgoin Jallieu (FR); Wilfried Favre, Chambery (FR); Jordi Veirman, La Motte-Servolex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 192 days.

(21) Appl. No.: 16/331,702

(22) PCT Filed: Sep. 7, 2017

(86) PCT No.: PCT/FR2017/052375
§ 371 (c)(1),
(2) Date: Mar. 8, 2019

(87) PCT Pub. No.: WO2018/046855
PCT Pub. Date: Mar. 15, 2018

(65) Prior Publication Data
US 2019/0247889 A1    Aug. 15, 2019

(30) Foreign Application Priority Data
Sep. 8, 2016    (FR) ...................................... 1658368

(51) Int. Cl.
*B07C 5/344*    (2006.01)
*H01L 31/18*    (2006.01)
*H01L 21/67*    (2006.01)

(52) U.S. Cl.
CPC .......... *B07C 5/344* (2013.01); *H01L 31/1804* (2013.01); *H01L 21/67271* (2013.01); *Y02E 10/547* (2013.01); *Y02P 70/50* (2015.11)

(58) Field of Classification Search
CPC ..... B07C 5/34; B07C 5/344; H01L 21/67271; H01L 31/1804; Y02P 70/50; Y02E 10/547
See application file for complete search history.

(56) References Cited

U.S. PATENT DOCUMENTS 3,372,003 A * 3/1968 Hideo ...................... C30B 15/20
117/35
3,865,554 A * 2/1975 Wenckus ................ C30B 15/30
117/202
(Continued)

FOREIGN PATENT DOCUMENTS

FR          2 964 459 A1    3/2012
WO    WO-2014162657 A1 * 10/2014    ........... C30B 15/203

OTHER PUBLICATIONS

International Search Report as issued in International Patent Application No. PCT/FR2017/052375, dated Nov. 22, 2017.
(Continued)

*Primary Examiner* — Joseph C Rodriguez
(74) *Attorney, Agent, or Firm* — Pillsbury Winthrop Shaw Pittman LLP (57) ABSTRACT

A Czochralski-type method for sorting wafers obtained by cutting a single-crystal silicon ingot, the method being implemented when the wafers are in an as-cut state or in a shaped-surface state. The method includes a) measuring the majority free charge carrier concentration in an area of each wafer; calculating the thermal donor concentration in the area of each wafer, on the basis of the majority free charge carrier concentration; calculating the charge carrier lifetime limited by the thermal donors in the area of each wafer, on
(Continued)

the basis of the thermal donor concentration; determining a bulk lifetime value for the charge carriers in each wafer on the basis of the lifetime limited by the thermal donors; comparing the bulk lifetime value or a normalised bulk lifetime value with a threshold value; and discarding the wafer when the bulk lifetime value or the normalised bulk lifetime value is lower than the threshold value.

13 Claims, 4 Drawing Sheets

(56) References Cited

U.S. PATENT DOCUMENTS

| | | | | |
|---|---|---|---|---|
| 5,641,353 | A * | 6/1997 | Hara | C30B 29/06 117/3 |
| 6,599,360 | B2 * | 7/2003 | Lida | C30B 15/206 117/19 |
| 7,700,394 | B2 * | 4/2010 | Sadamitsu | H01L 21/3225 438/45 |
| 8,481,346 | B2 * | 7/2013 | Ohno | H01L 22/14 438/18 |
| 8,617,311 | B2 * | 12/2013 | Ono | C30B 15/00 117/13 |
| 8,835,284 | B2 * | 9/2014 | Nakai | H01L 21/02664 438/473 |
| 2007/0193501 | A1 | 8/2007 | Ono et al. | |
| 2014/0212020 | A1 * | 7/2014 | Weber | G01N 21/6456 382/145 |
| 2019/0247889 | A1 * | 8/2019 | Letty | H01L 31/1804 |

OTHER PUBLICATIONS

Search Report as issued in French Patent Application No. 1658368, dated May 9, 2017.
Broisch, J., et al., "A New Method for the Determination of the Dopant-Related Base Resistivity Despite the Presence of Thermal Donors", IEEE Journal of Photovoltaics, vol. 5, No. 1, 2015, 7 pages.
Richter, A., et al., "Improved quantitative description of Auger recombination in crystalline silicon", Physical Review B 86, 165202, 2012, 14 pages.
Tomassini, M., et al., "Recombination activity associated with thermal donor generation in monocrystalline silicon and effect on the conversion efficiency of heterojunction solar cells", Journal of Applied Physics 119, 084508, 2016, 12 pages.
Veirman, J., et al., "A Fast and Easily Implemented Method for Interstitial Oxygen Concentration Mapping Through the Activation of Thermal Donors in Silicon," Energy Procedia, vol. 8, Apr. 2011, XP028263041, pp. 41-46.
Haunschild, J., et al., "Quality Control of Czochralski Grown Silicon Wafers in Solar Cell Production Using Photoluminescence Imaging," 26th European PV Solar Energy Conference and Exhibition, Sep. 2011, 7 pages.

* cited by examiner

METHOD FOR SORTING SILICON WAFERS ACCORDING TO THEIR BULK LIFETIME

CROSS REFERENCE TO RELATED APPLICATIONS

This application is the U.S. National Stage of PCT/FR2017/052375, filed Sep. 7, 2017, which in turn claims priority to French Patent Application No. 1658368 filed Sep. 8, 2016, the entire contents of all applications are incorporated herein by reference in their entireties.

TECHNICAL FIELD

The present invention concerns a method for sorting silicon wafers, carried out after they are cut from an ingot and before they are used for the manufacture of semiconductor devices, such as solar cells.

STATE OF THE ART

Approximately 10% to 20% of monocrystalline silicon wafers obtained by the Czochralski pulling method are incompatible with the manufacture of high-efficiency solar cells. These wafers in fact contain defects which limit the lifetime of the photogenerated charge carriers and lead to efficiency reductions which can be as high as 4% (absolute).

Defects which limit lifetime include thermal donors (DT). Thermal donors are agglomerates created from the interstitial oxygen contained in the silicon (i.e. the oxygen atoms occupy interstitial positions in the crystalline lattice). They are formed when the ingot is pulled, when the temperature of the silicon is between 350° C. and 500° C.

The wafers with the highest donor concentration, and the efficiency of which may consequently be limited, are generally located in the upper part of the ingot, also called the head of the ingot. This can be explained by the fact that the upper part of the ingot (i.e. the part of the ingot which is crystallised first) contains a larger quantity of oxygen, and also by the fact that it is cooled more slowly than the lower part of the ingot (which is crystallised last). Indeed, it remains in thermal contact with the silicon melt during the entire pulling period. The period during which the temperature of the silicon is within the range of formation of thermal donors (350° C.-500° C.) is therefore longer for the upper part of the ingot than for its lower part.

The thermal donors are destroyed during heat treatment at a temperature higher than or equal to 600° C. Homojunction solar cells, the manufacturing process of which uses such heat treatments, therefore no longer contain (virtually) any thermal donors, and their efficiency is not reduced. Conversely, processes where solar cells are manufactured at low temperature (<250° C.), such as the method for manufacturing heterojunction cells made of (amorphous/crystalline) silicon, do not enable the thermal donors to be eliminated. These thermal donors will affect the performance of the heterojunction cells by reducing the bulk lifetime of the carriers.

At the current time there is no solution to determine, a priori, i.e. on entry to a cell production line when the wafers are in an as-cut state, what the impact of the thermal donors present in the wafers will be on the future performance of the heterojunction solar cells. Such information would enable wafers of poor quality to be discarded before they start the cell manufacturing process, thereby making substantial economies.

The document ["Quality Control of Czochralski Grown Silicon Wafers in Solar Cell Production Using Photoluminescence Imaging", J. Haunschild et al., 26th European PV Solar Energy Conference and Exhibition, 5-9 Sep. 2011, Hamburg] proposes a method for sorting wafers intended for manufacture of homojunction solar cells, on the basis of photoluminescence images of the wafers. The photoluminescence images (used to perform the sorting) are taken after the wafers have undergone a step of high-temperature emitter diffusion. The wafers are therefore no longer in the as-cut state. When the photoluminescence image of a wafer has one or more black circles (i.e. a sign of low photoluminescence) this means that the efficiency of the finished solar cell will be low due to the presence of oxygen precipitates. This wafer can therefore be discarded.

These oxygen precipitates are defects relating to oxygen which are different to thermal donors, and can be differentiated from thermal donors in a photoluminescence image only after the thermal donors initially present in the wafers have been destroyed (hence the need to use the step of high-temperature diffusion). Indeed, the photoluminescence images of wafers containing high concentrations of thermal donors always have black circles, making it impossible to differentiate between high-efficiency wafers and low-efficiency wafers (after the homojunction cells have been manufactured).

This sorting method is therefore not applicable to silicon wafers in the as-cut state, due to the presence of the thermal donors. More generally, the above-mentioned document is not concerned in any way with the influence of the thermal donors on the performance of a heterojunction solar cell. It is concerned with the manufacture of homojunction solar cells, during which the thermal donors are destroyed (they are qualified as "harmless" in the document).

Additionally, this method of sorting wafers does not enable the manufacture of homojunction cells to be best optimised, since it requires that in each case the first step of the manufacturing method is accomplished: diffusion of the emitter (for example, 10 s at 800° C.). This step represents an unnecessary expense when the wafers are finally discarded.

SUMMARY OF THE INVENTION

There is therefore a need to provide a method for sorting wafers made of Czochralski type monocrystalline silicon which enables poor quality wafers to be discarded at lower cost. A wafer is said to be of poor quality when the performance of the semiconductor device (or devices) formed on this wafer is low.

According to the invention, this need tends to be satisfied by provide a method for sorting wafers, carried out when the wafers are in an as-cut state or in a surface-shaped state, this method comprising the following steps:
  a) measuring majority free charge carrier concentration in at least one area of each wafer;
  b) calculating the thermal donor concentration in said area of each wafer from the free charge carrier concentration;
  c) calculating the thermal donors-limited lifetime of the charge carriers in said area of each wafer, from the thermal donor concentration;
  d) determining a bulk lifetime value of the charge carriers in each wafer, from the thermal donors-limited lifetime;
  e) comparing the bulk lifetime value or a normalised value of the bulk lifetime to a threshold value; and f) discarding the wafer when the bulk lifetime value or the normalised value of the bulk lifetime is less than the threshold value.

The "as-cut state" refers to the state in which the manufacturer of ingots provides the silicon wafers to the manufacturers of semiconductor devices. At that point the wafers have not yet undergone any step of any semiconductor device manufacturing process. More specifically, they have not undergone any step able to modify the reflectivity of the wafer (e.g. texturisation step), to modify the bulk or surface lifetime of the charge carriers (e.g. passivation step), or to modify the charge carrier concentration (e.g. doping) or the thermal donor concentration (e.g. annealing). The wafers may possible have been cleaned, to remove cutting residues (e.g. dust), but without modifying their surface.

The wafers are in a so-called "surface-shaped" state after the as-cut wafers have undergone a step of shaping their surface, such as a texturing step or a step of mechanical and/or chemical polishing.

The method according to the invention sorts wafers on the basis of at least one value of the thermal donors-limited lifetime. The expression "thermal donors-limited lifetime" refers to the contribution of the thermal donors to the bulk lifetime of the charge carriers in a wafer. The thermal donors-limited lifetime is equal to the lifetime which the charge carriers would have had if the thermal donors were the only recombinant defects (i.e. ones which limit lifetime) present in the silicon, and overlooking the intrinsic recombination mechanisms. It gives a reliable insight into the performance which the semiconductor device or devices formed from this wafer will have, for example the efficiency of a heterojunction solar cell.

Thermal donors are, indeed, one of the defects which can most limit the bulk lifetime of the charge carriers. Thus, even if only thermal donors are considered, it is possible to undertake a satisfactory sorting of the wafers which will be a source of substantial economies. Wafers with a bulk lifetime which is too short are discarded and will not be used for the process of manufacturing solar cells.

Except for the steps of calculation and comparison with the threshold value, the sorting process according to the invention requires only a measurement of the concentration of majority free charge carriers, also called net doping, to determine the thermal donor concentration, and subsequently to calculate the thermal donors-limited lifetime. It is therefore particularly simple and economic to execute.

In particular, it makes no use of any preliminary step, such as the emitter diffusion in the sorting method of the prior art. In other words the wafers remains in the as-cut (or as-shaped) state throughout the method. The absence of any preliminary step constitutes a substantial economy compared to the sorting method of the prior art.

The majority free charge carrier concentration is measured in an area of each wafer where the thermal donor concentration is (theoretically) high, preferably in an area which is over 5 mm from the edges of the water, and even more preferentially in an area in the centre of the wafer. Indeed, the highest thermal donor concentration, and therefore the lowest thermal donors-limited lifetime, is generally observed in the centre of the wafers.

Advantageously, the sorting method further comprises a step of calculating the charge carrier lifetime limited by intrinsic recombination mechanisms in said area of each wafer, the bulk lifetime value being further determined from the lifetime limited by the intrinsic recombination mechanisms. The inclusion of the intrinsic recombination mechanisms (Auger recombinations and radiative recombinations) in the calculation of the bulk lifetime (in addition to the thermal donors) enables the sorting conditions to be made more stringent, since the lifetime value to be compared with the threshold will be lower still.

In a preferential embodiment of the sorting method, the free charge carrier concentration in said at least one area is determined from a measurement of photoluminescence of the wafer. Photoluminescence is a precise and fast measuring technique which, when used in imaging, enables a multitude of free charge carrier concentration values to be obtained in a single operation. Photoluminescence equipment also has a throughput equivalent to that of a solar cell production line. The sorting method, carried out at the entrance to the line, will therefore not slow the manufacturing of the cells. When the photoluminescence technique is used, the thickness of the wafers is advantageously less than 580 μm.

The method according to the invention may also have one or more of the characteristics below, considered individually, or in all technically possible combinations:

steps a) to d) are carried out in several areas of each wafer, from which a plurality of bulk lifetime values is obtained for each wafer, and the method also comprises a step of determining, from the plurality of bulk lifetime values, a minimum lifetime value, said minimum value being compared to the threshold value in step e);

when the wafers contain dopants, the method further comprises a step of measuring the dopant concentration of each wafer, the thermal donor concentration in said area of each wafer being calculated in step b) from the majority free charge carrier concentration and the dopant concentration;

the dopant concentration of each wafer is obtained by measuring the majority free charge carrier concentration in an area in the immediate vicinity of one edge of the wafer;

the majority free charge carrier concentration in the area in the immediate vicinity of the edge of the wafer is derived from a photoluminescence measurement;

the normalised value of the bulk lifetime is calculated from the bulk lifetime value obtained in step d) and a resistivity value of the wafer; and the wafers are n-type doped.

Another aspect of the invention concerns a method for sorting wafers which is specially designed for the wafers produced from Czochralski-type monocrystalline silicon ingots containing p-type dopants, in which there is a risk of doping inversion due to the formation of the thermal donors.

This method is also carried out when the wafers are in an as-cut state or in a surface-shaped state. It comprises the following steps:

making measurements of a parameter representing the majority free charge carrier concentration in each wafer, where the measurements are distributed between an edge and the centre of the wafer;

determining whether said parameter decreases continuously between the edge and centre of each wafer; and when said parameter decreases continuously, the following steps:

a) measuring the majority free charge carrier concentration in at least one area of the wafer;

b) calculating the thermal donor concentration in said area of the wafer from the majority free charge carrier concentration;

c) calculating the thermal donors-limited lifetime of the charge carriers in said area of the wafer, from the thermal donor concentration;

d) determining a bulk lifetime value of the charge carriers in the wafer, from the thermal donors-limited lifetime;
e) comparing the bulk lifetime value with a first threshold value;
f) discarding the wafer when the bulk lifetime value is less than the first threshold value; and when said parameter does not decrease continuously, the following steps:

determining a relative variation of said parameter between the minimum of said parameter and a value of said parameter in the centre of the wafer;
comparing the relative variation of said parameter with a second threshold value;
discarding the wafer when the second relative variation of said parameter is higher than the second threshold value;
carrying out steps a) to f) when the relative variation of said parameter is less than the second threshold value.

BRIEF DESCRIPTION OF THE FIGURES

Other characteristics and advantages of the invention will become clear from the description which is given of it below, by way of example and non-restrictively, with reference to the appended figures, in which.

For greater clarity, identical or similar elements are identified by identical reference signs in all the figures.

DETAILED DESCRIPTION OF AT LEAST ONE EMBODIMENT

A monocrystalline silicon ingot obtained by the Czochralski (CZ) method contains a large quantity of thermal donors, since the silicon has a high concentration of interstitial oxygen and cools slowly. These thermal donors are then found in the silicon wafers derived from the cutting of the ingot.

The thermal donors have two effects on the properties of the silicon. Firstly they influence the majority free charge carrier concentration, commonly called the net doping, since each thermal donor generates two free electrons. Secondly, certain thermal donors act as centres of recombination of electron-hole pairs, which limits the bulk lifetime of the charge carriers.

The sorting methods described below exploit these two effects, respectively to determine the thermal donor concentration from the majority free charge carrier concentration, and to determine the thermal donors-limited lifetime from the thermal donor concentration.

These methods are carried out when the wafers are, preferably, in the as-cut state.

Figure 1:
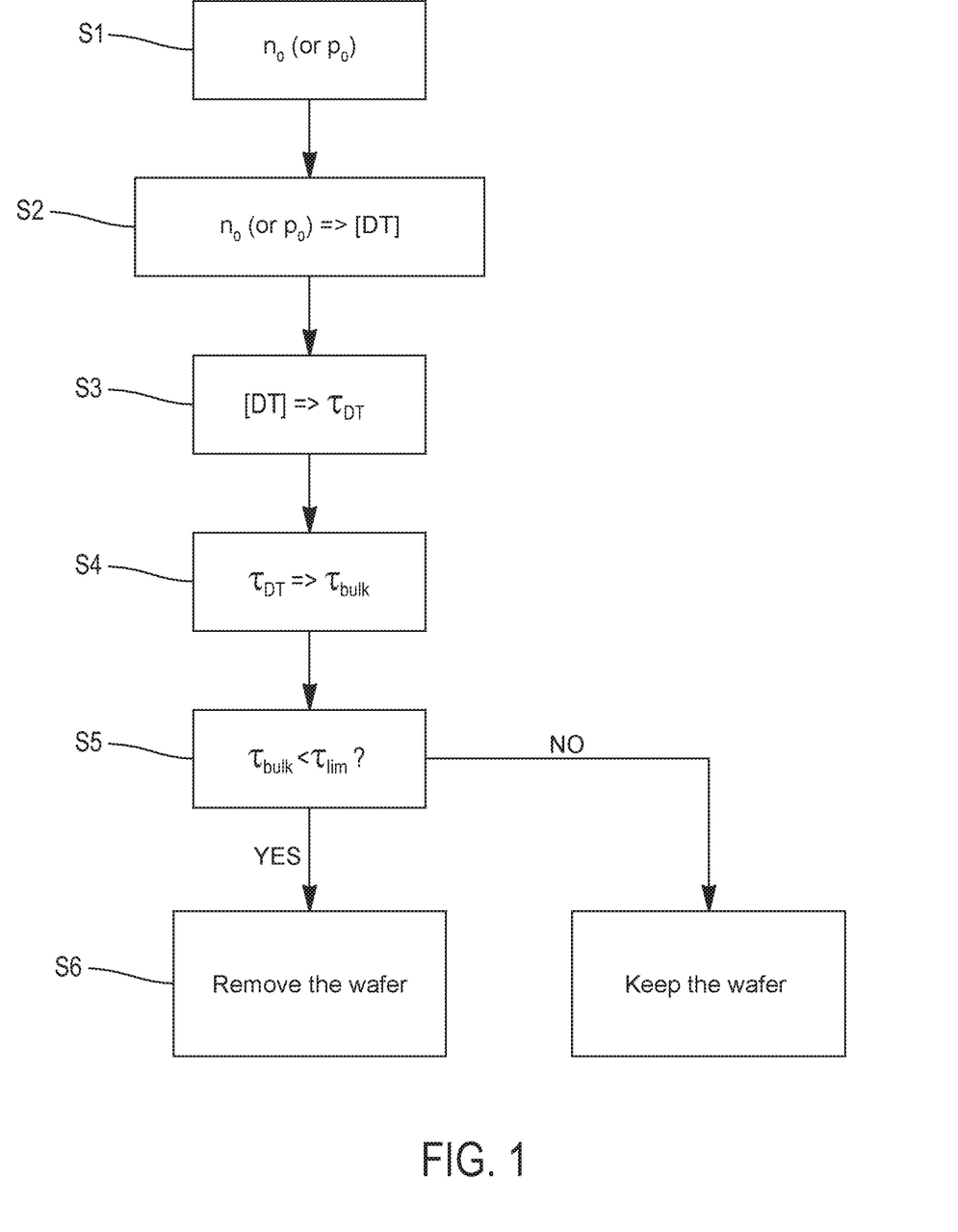
FIG. 1 schematically represents steps S1 to S6 of a first sorting method according to the invention.

FIG. 1 schematically represents steps S1 to S6 of a first silicon wafer sorting method according to the invention. These wafers are, for example, intended for the manufacturing of solar cells. The wafers may be of any shape, for example circular, square or pseudo-square.

Step S1 consists in measuring the majority free charge carrier concentration in at least one area of each silicon wafer to be sorted. The majority free charge carrier concentration, noted below no in the case of an n-type doped silicon (majority electrons) and $p_0$ in the case of a p-type doped silicon (majority holes), is written as follows:

$$n_0 = N_d + 2[DT] \quad (1a)$$

$$p_0 = N_a - 2[DT] \quad (1b)$$

where $N_d$ is the concentration of donor dopants (phosphorus, arsenic, antimony, etc.) introduced deliberately into the silicon, $N_a$ is the concentration of acceptor dopants (boron, gallium, aluminium, etc.) introduced deliberately into the silicon, and [DT] is the concentration of thermal donors formed during the pulling of the ingot.

Various techniques can be used to measure free charge carrier concentration $n_0/p_0$. This concentration can be derived in particular from a measurement of electrical resistivity (for example supplied by the four points method), or from a microwaves reflectivity measurement (for example by the technique of Time-Resolved Microwave Conductivity). The infrared imaging technique called "Carrier Density Imaging" is also a (direct) method of measuring free charge carrier concentration $n_0/p_0$.

The area in which the free charge carrier concentration is measured is, in the remainder of the description, called the "measuring area".

In step S2 of FIG. 1, the thermal donor concentration [DT] is determined in the measuring area of each wafer to be sorted, from corresponding charge carrier concentration $n_0/p_0$. The thermal donor concentration [DT] is preferably calculated using relationship (1a) or (1 b) above.

When the wafers contain acceptor or donor dopants, for example boron or phosphorus atoms, the determination of the thermal donor concentration [DT] supposes that acceptor dopant concentration $N_a$ or donor dopant concentration $N_d$ in each wafer is known (cf. relationships (1 a) and (1b)). When this dopant concentration $N_a/N_d$ is unknown it can easily be obtained from one of the charge carrier concentration values $n_0/p_0$ measured in the immediate vicinity of an edge of the wafer, and preferably in the area furthest from the centre of the wafer.

The authors of the article ["A New Method for the Determination of the Dopant-Related Base Resistivity Despite the Presence of Thermal Donors", J. Broisch et al., IEEE Journal of Photovoltaics, Vol. 5, No. 1, 2015] have indeed demonstrated that the thermal donor concentration [DT] could be considered negligible in the four corners of a square wafer and that, consequently, the electrical resistivity measured in the corners was due solely to the dopants introduced deliberately into the silicon.

In the sorting method according to the invention, the thermal donor concentration [DT] is assumed to be zero in one point of the wafer if it is less than 5 mm, and preferentially less than 1 mm, from any edge of the wafer; in other words in an entire peripheral band of the wafer, not only in its corners.

Measuring free charge carrier concentration $n_0$ (respectively $p_0$) at this point then directly gives the donor dopant concentration $N_d$ (respectively acceptor dopant concentration $N_a$) ($n_0 = N_d$ or $p_0 = N_a$).

When the wafers are square in shape, the donor dopant concentration $N_d$ (respectively acceptor dopant concentration $N_a$) is advantageously obtained from a value of concentration $n_0$ (respectively $p_0$) measured in a corner of the wafer, less than 5 mm from each of the two adjacent sides forming this corner, and preferably less than 1 mm from each of the two sides. The measuring error due to the above hypothesis is thus minimal. In the same manner, when the wafers are pseudo-square in shape, the donor dopant concentration $N_d$ (respectively acceptor dopant concentration $N_a$) is advantageously obtained from a value of concentration $n_0$ (respectively $p_0$) measured in immediate proximity to one of the truncated corners of the wafer, i.e. less than 5 mm from the ridge formed by the truncation of the corner, and preferably less than 1 mm from this ridge.

The hypothesis can then be adopted that acceptor dopant concentration $N_a$ or donor dopant concentration $N_d$ is constant across the entire surface of the wafer which, in step S2, enables the thermal donor concentration [DT] in any area of the wafer to be determined (if free charge carrier concentration $n_0/p_0$ is known in this area).

After this, in S3 (FIG. 1), the thermal donors-limited lifetime τDT is calculated in the wafers' measuring area, from the thermal donor concentration [DT] determined in step S2.

As previously stated, the thermal donors limit the bulk lifetime of the charge carriers by acting as centres for indirect recombination of the electron-hole pairs. The mechanism for recombination of the thermal donors can therefore be described using the Shockley Read Hall (SRH) model. According to this model, recombination of an electron-hole pair is accomplished not by direct transition of an electron in the conduction band to the valence band, but through a recombination centre (in this case a thermal donor configuration) which introduces an energy level into the bandgap of the silicon.

According to the SRH model, the lifetime limited by SRH recombination centres is written as follows:

$$\tau_{SRH} = \frac{\frac{p_0 + p_1 + \Delta p}{\sigma_n, N_T, v_{th,e}} + \frac{n_0 + n_1 + \Delta p}{\sigma_p, N_T, v_{th,h}}}{p_0 + n_0 + \Delta p} \quad (2)$$

where:
$\sigma_n$ and $\sigma_p$ are the effective capture sections of the recombination centres for the electrons and the holes respectively;
$v_{th,e}$ and $v_{th,h}$ are the thermal speeds of the electrons and of the holes, respectively;
$N_T$ is the density of the recombination centres;
$n_0$ and $p_0$ are the charge carrier concentrations at thermodynamic equilibrium;
$n_1$ and $p_1$ are the densities at equilibrium of electrons and of holes, respectively, when the Fermi level coincides with level of energy E introduced by the recombination centres $$\left(\text{i.e. } n_1 = N_C \exp\left(\frac{E - E_C}{kT}\right) \text{ and } p_1 = N_V \exp\left(\frac{E_V - E}{kT}\right)\right);$$

and $\Delta p$ is the injection level, i.e. the surplus charge carrier concentration (i.e. not in thermodynamic equilibrium).

The study of Tomassini et al. (["Recombination activity associated with thermal donor generation in monocrystalline silicon and effect on the conversion efficiency of heterojunction solar cells", Journal of Applied Physics 119, 084508, 2016] enabled it to be determined that only thermal donors with configuration X acted as SRH recombination centres. This study also gives the parameters of the SRH model in the case of the thermal donors (in the X configuration), and more specifically:

the density of the recombination centres (in $cm^{-3}$):

$$N_T = 0.1268 \times [DT] + 3{,}956.10^{13}$$

the position of the energy level associated with the thermal donors in the X configuration (in eV):

$$E_c - E = 15.46 \times [DT]^{-0.12}$$

the effective capture section of the electrons and holes (in $cm^2$):

$$\sigma_n = 3{,}16.10^{-54} \times N_T^{2,41}$$

$$\sigma_p = 4{,}01.10^{-40} \times N_T^{1,53}$$

All these parameters depend on the thermal donor concentration [DT]. Thus, by injecting them into the SRH model given above, a relationship expressing the thermal donors-limited lifetime ($\tau_{SRH} = \tau DT$) is obtained as a function of the thermal donor concentration [DT]. This relationship is advantageously used in step S3 to determine the thermal donors-limited lifetime τDT.

After this, in S4, a bulk lifetime value $\tau_{bulk}$ of the charge carriers in the measuring area of each wafer is calculated, from the thermal donors-limited lifetime τDT.

There are various recombination mechanisms which limit the bulk lifetime of the charge carriers in silicon: radiative recombinations and recombinations using the Shockley Read Hall mechanism (SRH combinations), mentioned above, and activated, for example, by the thermal donors. The Auger and radiative mechanisms are intrinsic to the semiconductor material, i.e. their amplitude does not depend on the presence of recombinant defects in the material, unlike the SRH mechanism.

In certain cases, for example for low levels of injection ($\Delta p < 10^{15}$ $cm^{-3}$), the intrinsic recombination mechanisms (Auger and radiative) can be disregarded, since the influence of the thermal donors on bulk lifetime $\tau_{bulk}$ is predominant. Bulk lifetime $\tau_{bulk}$ is then equal to thermal donors-limited lifetime τDT.

When it is considered, on the contrary, that the bulk lifetime of the charge carriers is not only limited by the thermal donors, and that the recombinations of the Auger and/or radiative type are not negligible (case of high-efficiency solar cell architectures), the sorting method advantageously comprises a step of calculating lifetime $\tau_{int}$ limited by the intrinsic recombination mechanisms.

Lifetime $\tau_{int}$ limited by intrinsic recombination mechanisms can be calculated from free charge carrier concentration $n_0/p_0$, for example according to the relationship given in the article ["Improved quantitative description of Auger recombination in crystalline silicon", Richter et al., Physical Review B 86, 165202, 2012].

The calculation of bulk lifetime $\tau_{bulk}$ is then made from thermal donors-limited lifetime τDT and from lifetime $\tau_{int}$ limited by the intrinsic recombination mechanisms, according to the following relationship:

$$\tau_{bulk} = \cfrac{1}{\cfrac{1}{\tau_{DT}} + \cfrac{1}{\tau_{int}}} \qquad (4)$$

Bulk lifetime value $\tau_{bulk}$ calculated in this manner is more accurate, and sorting of the wafers performed on the basis of this value is more rigorous.

Bulk lifetime $\tau_{bulk}$ value calculated in step S4 in the measuring area from thermal donors-limited lifetime τDT and, preferably, from lifetime $\tau_{int}$ limited by the intrinsic recombination mechanisms, is the best (i.e. the highest) bulk lifetime value which it is possible to attain in this area, since SRH type defects other than thermal donors (metal impurities, oxygen precipitates, etc.) have not been considered. The real bulk lifetime in the area will probably be lower, due to these defects which it is not possible to quantify, or the existence of which is unknown. Despite this, the sort operation performed will have already enabled a large proportion of the poor-quality wafers to be eliminated.

When information is held on these other defects acting as an SRH recombination centre, in particular their density ($N_T$), their capture section ($\sigma_n$, $\sigma_p$) and their energy level (E), their contribution should be included when calculating bulk lifetime $\tau_{bulk}$. This enables an even more precise estimate of the bulk lifetime in the wafer to be obtained. The bulk lifetime is then given by the following relationship:

$$\frac{1}{\tau_{bulk}} = \frac{1}{\tau_{DT}} + \frac{1}{\tau_{int}} + \frac{1}{\tau_{SHR\,2}} + \frac{1}{\tau_{SHR\,3}} + \cdots$$

where $\tau_{srh\,2}$ and $\tau_{srh\,3}$ are the lifetimes limited by a second and third type of recombinant defects, calculated using the SRH model.

Thermal donors-limited lifetime τDT, lifetime $\tau_{int}$ limited by the intrinsic recombination mechanisms, and, if applicable, lifetimes $\tau_{srh\,2}$, $\tau_{srh\,3}$ (and therefore bulk lifetime $\tau_{bulk}$) are advantageously calculated at a given injection level, chosen by the user depending on how the wafers are to be used. When manufacturing solar cells, it will be possible to choose an injection level comprised between $10^{14}$ cm$^{-3}$ and $10^{16}$ cm$^{-3}$, and preferably equal to $10^{15}$ cm$^{-3}$.

Step S5 of FIG. 1 consists in comparing bulk lifetime value $\tau_{bulk}$ obtained in step S4 with a lifetime threshold value, noted below $\tau_{lim}$. When bulk lifetime value $\tau_{bulk}$ of a wafer is higher than threshold $\tau_{lim}$ ("NO" output in S5), this means that the quality of the wafer is satisfactory. The wafer can therefore be kept. Conversely, when bulk lifetime value $\tau_{bulk}$ is less than threshold $\tau_{lim}$ ("YES" output in S5), the wafer is considered to be of poor quality. It is then discarded in a final step S6 of the sorting method.

The area of the wafer in which the free charge carrier concentration ("measuring area") is measured (in step S1), and the bulk lifetime of which is calculated (by means of steps S2 to S4), is advantageously more than 5 mm from the edges of the wafer. Indeed, the thermal donor concentration on the periphery of the wafer (over a strip 5 mm wide) is not sufficiently high to accomplish a satisfactory sorting of the silicon wafers (as a reminder, it is even considered as zero for the purposes of determining dopant concentration $N_a/N_d$).

Steps S1 to S4 of the sorting method are preferably carried out in the central area of the wafer. This enables the silicon wafers to be sorted effectively whilst minimising the number of measurements. Indeed, according to the above-mentioned article by J. Broisch et al., the thermal donor concentration [DT] of a Cz silicon wafer is at its maximum in an area in the centre of the wafer, and gradually decreases when moving from the centre of the wafer (reaching a near-zero concentration at the edges). It is, consequently, at the centre of the wafer that one expects to find the lowest bulk lifetime value. A wafer sorting method limited to a single area distant from the centre of the wafer will be less precise and consequently less effective.

For the sake of clarification, if the lowest bulk lifetime value is not in the centre of the wafer, steps S1 to S4 of the sorting method can be carried out in several areas of a given wafer, preferably including the central area. This enables several bulk lifetime values $\tau_{bulk}$ to be obtained for a given wafer. In this case, the sorting method advantageously comprises a step consisting in determining, from among the various bulk lifetime values $\tau_{bulk}$, the lowest one, or in other words the one which is most constrictive to accomplish the sorting. The comparison of step S5 is then made between threshold value $\tau_{lim}$ and this minimum bulk lifetime value $\tau_{bulk}$.

In a general sense, the reproduction of steps S1 to S4 in various measuring areas of the wafer improves the wafer sorting quality. By increasing the number of measurements, the bulk lifetime value extracted and compared to threshold value $\tau_{lim}$ in step S5 has a greater likelihood of being representative of (true) minimum bulk lifetime value $\tau_{bulk}$ of the wafer. The exclusion of the wafers of poor quality will therefore be more accurate. Conversely, the sorting method can take longer to perform, since there are more measurements and calculations. The number and locations of these measuring areas can differ from one wafer to the next.

Threshold value $\tau_{lim}$ is preferably set in accordance with the performance of the solar cells expected by the manufacturers, bearing in mind the method used to manufacture these cells. It can be determined empirically by each solar cells manufacturer, by comparing the lifetimes of the wafers and the efficiencies of the finished cells for a sample of wafers. It can also be obtained by means of simulations of cell performance: these simulations take the architectures of the cells into account.

For example, for an optimised method of manufacturing (amorphous/crystalline) silicon heterojunction cells (HET), the maximum theoretical efficiency of which is 24.5%, a threshold value $\tau_{lim}$ equal to 3 ms (for an injection level Δp of $1.10^{15}$ cm$^{-3}$) would enable an efficiency of at least 23.5% to be obtained with all the wafers derived from the sort operation. For a manufacturing method which can be improved further, enabling a theoretical efficiency of approximately 21.6% to be best attained, a threshold value $\tau_{lim}$ of around 1 ms would enable an efficiency of at least 20.6% to be attained with all the sorted wafers.

Threshold value $\tau_{lim}$ can also be set taking account of the acceptor or donor dopant concentrations of the wafers. Indeed, by setting a threshold value $\tau_{lim}$ which is too constrictive, i.e. very high, wafers the low bulk lifetime of which is due to a sudden variation of the doping in the measuring area, not to a high thermal donor concentration, may be discarded. It is considered that the dopant concentration can vary between the edge and centre of the wafer by 30% at maximum. The thermal donor concentration [DT] above which it is possible to discard a wafer should therefore be 15% higher than $N_a$ or $N_d$. In other words, it is possible to set threshold value $\tau_{lim}$ at the bulk lifetime value calculated for a concentration [DT] equal to 15% of $N_a$ or $N_d$.

As an example, in the case of wafers doped with phosphorus with a dopant concentration [P] equal to $2.4 \times 10^{15}$ cm$^{-3}$ (2 Ωcm) and a thermal donor concentration [DT] of less than 3.75×10$^{14}$ cm$^{-3}$, it is difficult to differentiate the influence of the thermal donors on the net doping of the natural variation of the dopant concentration [P]. To enable a sort to be performed which effectively takes the thermal donors into account, threshold value $\tau_{lim}$ should therefore be less than 8.2 ms (value obtained with relationships (2) to (4) above taking [DT]=3.75×10$^{14}$ cm$^{-3}$ and an injection level of 10$^{15}$ cm$^{-3}$).

A sort can also be made on the basis of a normalised value of the bulk lifetime. In step S5, this normalised value of the bulk lifetime will then be compared to another threshold (in the same units), rather than compare two lifetime values (in s). The value of the bulk lifetime is preferably normalised compared to the electrical resistivity. The normalised value of the bulk lifetime is obtained by dividing bulk lifetime value $\tau_{bulk}$ calculated in step S4 by resistivity ρ ($\tau_{bulk}/\rho$). Indeed, resistivity greatly influences lifetime, and it is easier to attain high lifetimes when resistivity is high.

Steps of calculation S2-S4 and of comparison with the threshold value S5 can be carried out by a calculation unit such as a microprocessor.

In a preferential embodiment of the sorting method, free charge carrier concentration $n_0/p_0$ is measured in step S1 by photoluminescence (PL). Photoluminescence is a widespread technique to characterise a semiconductor material. It is based on the excitation of the semiconductor material by a light source in order to generate free charge carriers, and on the optical detection of the radiative recombinations of these carriers. Intensity $I_{PL}$ of the photoluminescence signal obtained in the wafers measuring area is expressed (at a low injection level) by the following relationship:

$I_{PL} \propto n_0 G \tau_{eff}$ in $n$-type silicon;

$I_{PL} \propto p_0 G \tau_{eff}$ in $p$-type silicon;

where $\tau_{eff}$ is the effective lifetime of the photogenerated charge carriers, and G the rate of generation of charge carriers.

In a thin as-cut wafer, which is less than 580 μm thick, effective lifetime of the charge carriers $\tau_{eff}$ is essentially limited by the surface recombinations. Indeed, since the passivation of the defects present at the surface of the wafer has not yet taken place, a large majority of the photogenerated charge carriers are recombined at the surface. Effective lifetime of the charge carriers $\tau_{eff}$ is therefore roughly equal to the lifetimes of the charge carriers limited by surface recombinations $\tau_{surf}$. Furthermore, since the as-cut wafers are of roughly uniform thickness, rate of generation G and surface lifetime of the charge carriers $\tau_{surf}$ can be assumed to be constant. Intensity $I_{PL}$ of the photoluminescence signal is therefore proportional to free charge carrier concentration $n_0/p_0$:

$I_{PL} \propto n_0$ in $n$-type silicon; and $I_{PL} \propto p_0$ in $p$-type silicon.

Thus, if the value of the photoluminescence signal in an area of the wafer is extracted, free charge carrier concentration $n_0/p_0$ in this same area can be deduced from it.

Figure 2:
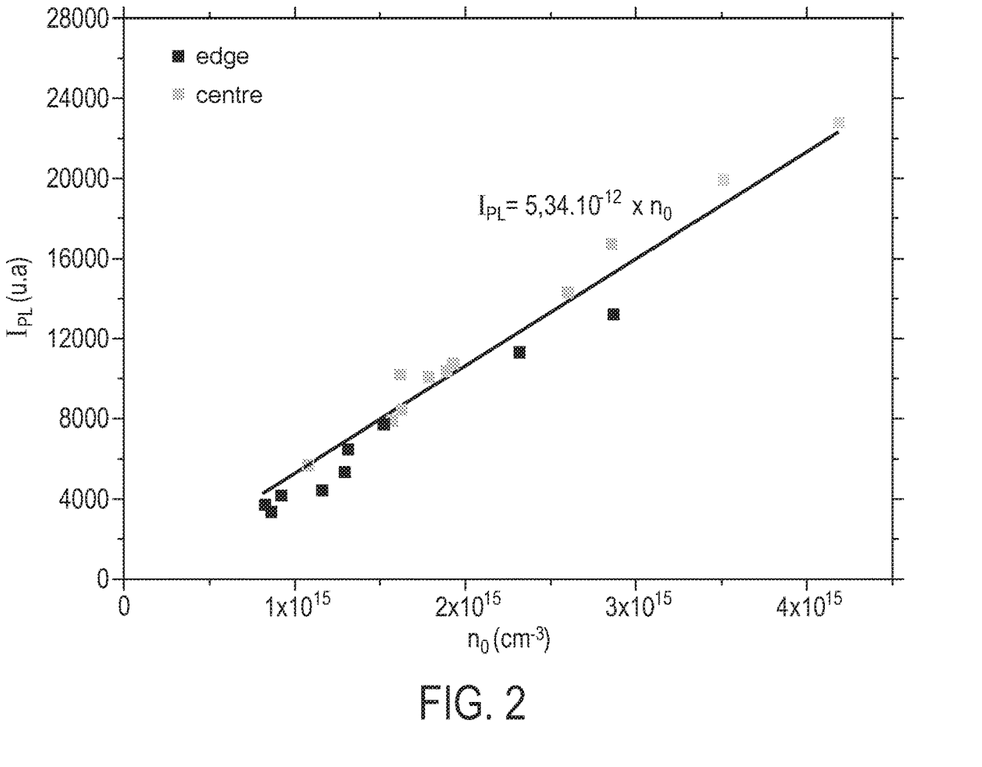
FIG. 2 is a calibration curve of a photoluminescence device, enabling the free charge carrier concentration in step S1 of FIG. 1 to be measured.

The proportionality factor between intensity $I_{PL}$ and concentration $n_0/p_0$ depends, among other factors, on the equipment used to measure photoluminescence. A prior step of calibration can therefore be carried out in order to determine this proportionality factor. The calibration step can consist of a series of photoluminescence measurements using the equipment to be calibrated, with "sample" silicon wafers the free charge carrier concentration of which is known. The sample wafers preferably have the same morphological characteristics (thickness, surface condition) as the wafers to be sorted, and in particular are less than 580 μm thick.

The free charge carrier concentration of the sample wafers can be measured by a technique other than photoluminescence, for example by measurement of electrical resistivity.

The conditions for acquisition of the photoluminescence signal, in the calibration step and then in step S1 of measurement of free charge carrier concentration $n_0/p_0$, can be as follows:

the excitation source (typically a laser) illuminates the silicon wafers at a wavelength of less than 1100 nm, and preferably less than 915 nm, in order to generate electron-hole pairs in the silicon bandgap:

the illumination time is less than or equal to 30 s, and preferably less than 1 s, so as to be compatible with the throughput of a solar cell production line;

the power of the excitation source is between 0.01 W/cm$^2$ and 1 W/cm$^2$;

photoluminescence detection is accomplished (in imaging) using a photodetector with a spatial resolution of less than 5 mm (dimensions of the pixels: 5 mm×5 mm), and preferably less than 1 mm (1 mm×1 mm).

FIG. 2 is a graphical representation of the measurements made during calibration of a photoluminescence device, for example model "LIS-R2" sold by the company BT-Imaging. This graphic represents intensity $I_{PL}$ of the photoluminescence signal measured in various areas of the sample wafers (all n-type), as a function of the majority free charge carrier concentration ($n_0$) in these same areas. In this case there are two measuring areas, one in the centre of the wafer, the other close to the edge of the wafer.

The proportionality factor between intensity $I_{PL}$ and majority free charge carrier concentration $n_0/p_0$ is determined by linear regression of the measuring points. In this calibration example, it is equal to 5.34×10$^{-12}$ hits.cm$^3$.

Current photoluminescence devices enable a complete image of each wafer to be obtained rapidly. Thus, using this technique, it is possible to obtain free charge carrier concentration $n_0/p_0$ in a large number of measuring areas simultaneously.

Figure 3:
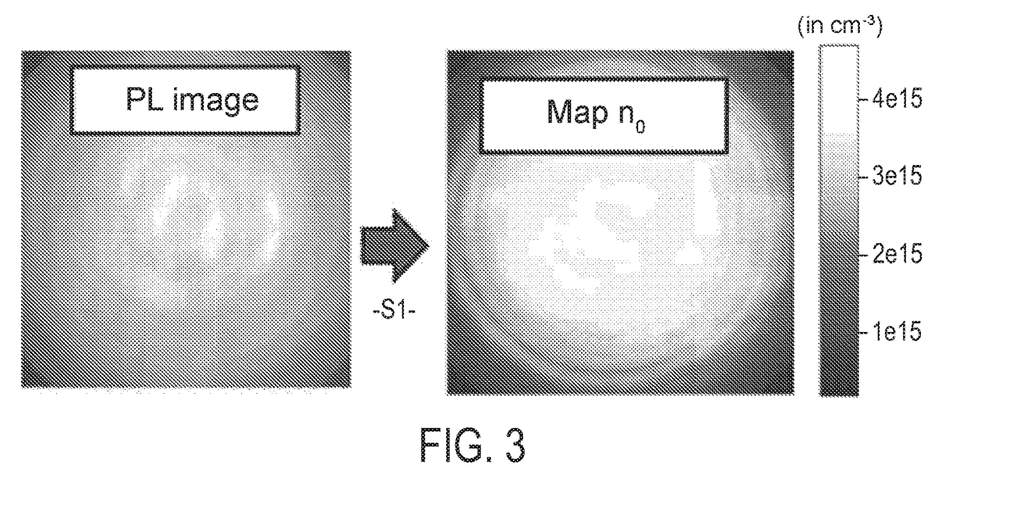
FIG. 3 illustrates a preferential embodiment of step S1 of FIG. 1.

Due to the proportionality factor, a photoluminescence (PL) image can be converted in step S2 of the sorting method into a map of majority free charge carrier concentration $n_0/p_0$. This preferential embodiment of step S2 is schematically represented by FIG. 3.

Figure 4:
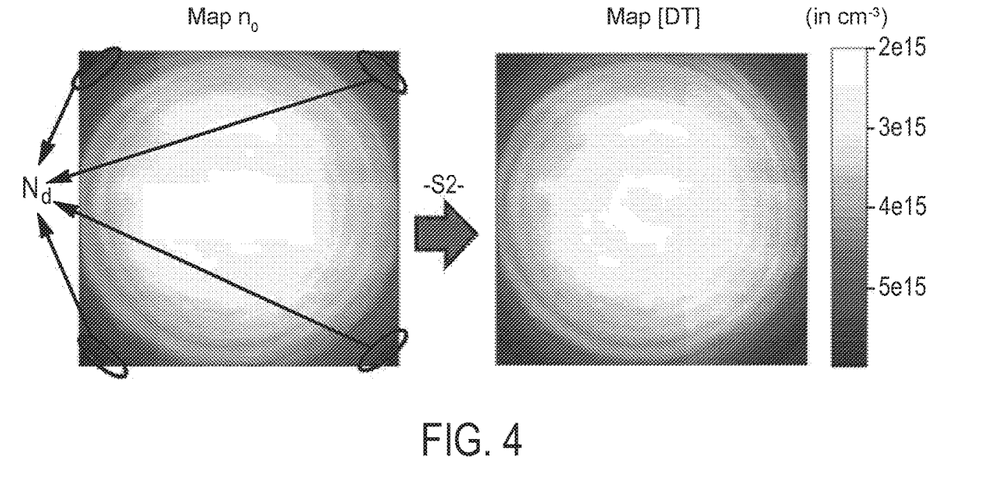
FIG. 4 illustrates a preferential embodiment of step S2 of FIG. 1.

It is then possible to extract from the $n_0/p_0$ map acceptor dopant concentration $N_a$ or donor dopant concentration $N_d$ within the wafer, for example using the $n_0/p_0$ values measured at the corners of the wafer. Unlike other techniques (in particular measurement of electrical resistivity), photoluminescence enables the concentration $n_0/p_0$ closest to the edges of the wafer to be obtained. The charge carrier concentration $n_0/p_0$ map is then converted into a map of the thermal donor concentration [DT] in step S3 of the sorting method. These two operations are schematically represented by FIG. 4.

Figure 5:
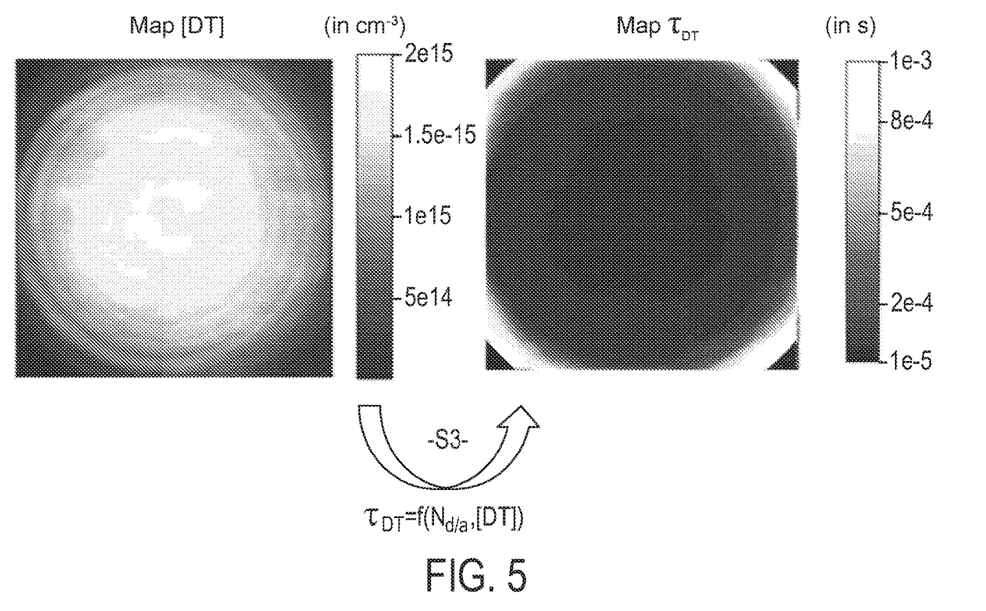
FIG. 5 illustrates a preferential embodiment of step S3 of FIG. 1.

Finally, as represented in FIG. 5, the map of thermal donor concentration [DT] can be converted into a map of thermal donors-limited lifetime τDT in step S3.

The first sorting method described above with reference to FIGS. 1 to 5 is applicable both to n-type doped silicon wafers (majority electrons) and to p-type doped silicon wafers (majority holes). The number and nature of the chemical elements used as dopants in the wafers (boron, phosphorus, arsenic, antimony, etc.) have no influence on sorting. The method could even be applied to wafers doped only with thermal donors (therefore necessarily n-type), i.e. wafers from an ingot in which no dopant has been deliberately introduced.

In rare cases, the quantity of thermal donors in a p-type doped wafer can, locally, be so great that a change of type of conductivity occurs within the wafer. Typically, the edges of the wafer are p-type doped, while the centre of the wafer, which is rich with thermal donors, would become n-type doped.

This situation, known as a doping inversion situation, can occur in particular when the wafer is extracted from the upper part of the ingot. A wafer which has an inversion of the doping type (i.e. from p-type to n-type) will not necessarily be removed by the sorting method of FIG. 1. It will however lead to a very inefficient solar cell, or even to an inoperative solar cell.

Figure 6:
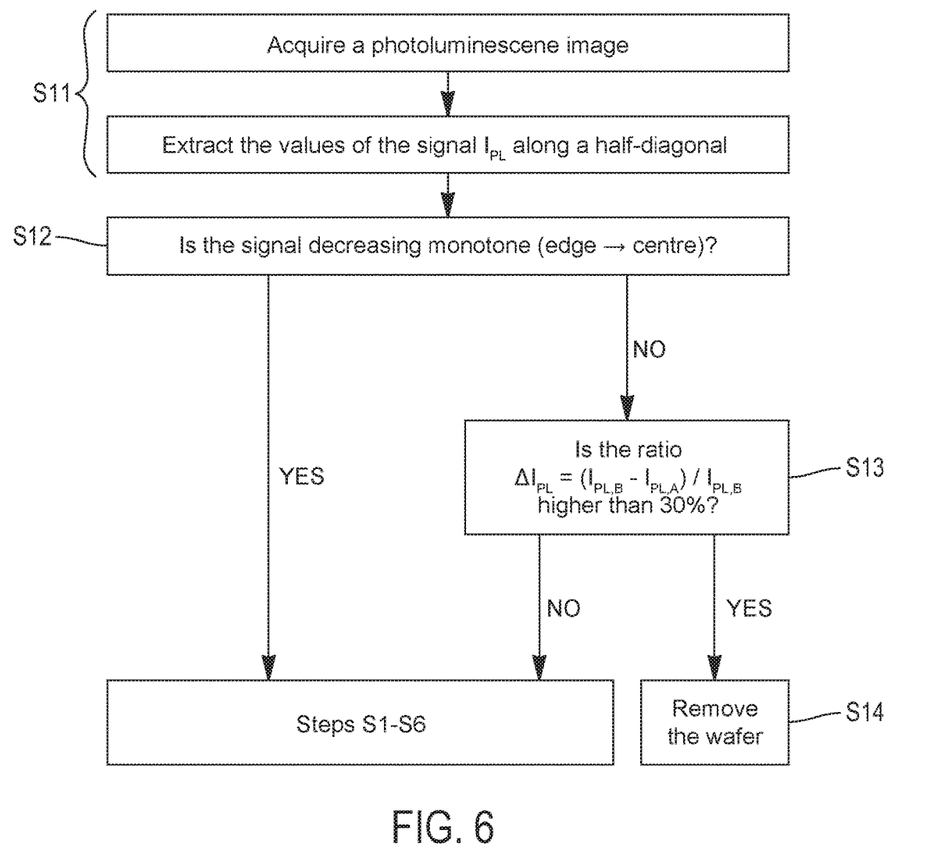
FIG. 6 schematically represents steps of a second sorting method according to the invention, which is specially designed for silicon wafers containing p-type dopants.

FIG. 6 represents steps S11 to S14 of a second sorting method, derived from the first method described in relation with FIG. 1, to identify and remove this type of wafer.

This second sorting method starts with a step S11 during which measurements of a parameter representative of majority free charge carrier concentration $n_0/p_0$ are made in each wafer to be sorted. The measuring points are distributed between an edge and the centre of the wafer and, preferably, aligned along a half-diagonal or radius of the wafer.

The parameter representing the majority free charge carrier concentration can be the signal of a characterisation device, which varies according to the majority free charge carrier concentration, for example electrical resistivity or microwave reflectivity. By definition, the expression "parameter representing the majority free charge carrier concentration" may make reference to the majority free charge carrier concentration itself.

In the preferential embodiment of step S11 represented in FIG. 6, the parameter representative of majority free charge carrier concentration $n_0/p_0$ is photoluminescence intensity $I_{PL}$. Step S11 then consists in acquiring a photoluminescence image of each wafer, and then in extracting from this image photoluminescence intensity values distributed between the edge and centre of the wafer. Using these values, it is then possible to plot a curve representing the variation of signal $I_{PL}$ from the edge to the centre of the wafer.

During a step S12, a check is made whether photoluminescence intensity $I_{PL}$ decreases continuously between the edge and centre of the wafer, i.e. whether the curve of intensity $I_{PL}$ decreases in a monotone manner.

If photoluminescence intensity $I_{PL}$ decreases continuously between the edge and centre of the wafer ("YES" output in S13), this means that there is no inversion of the doping type in the wafer. This diminution of signal $I_{PL}$ is representative of a (continuous) diminution of the hole concentration, probably caused by an (also continuous) increase of the thermal donor concentration. Steps S1 to S6 described above in relation with FIG. 1 are then carried out (by advantageously re-using the values of signal $I_{PL}$ in step S1) to check whether the quality of the wafer is satisfactory in terms of bulk lifetime.

Figure 7A:
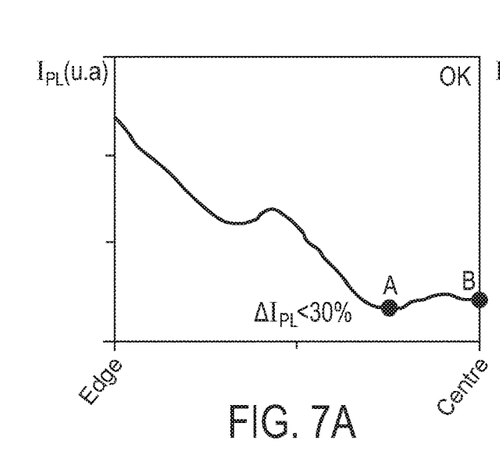
FIGS. 7A and 7B represent curves of the photoluminescence intensity for two silicon wafers containing p-type dopants.
Figure 7B:
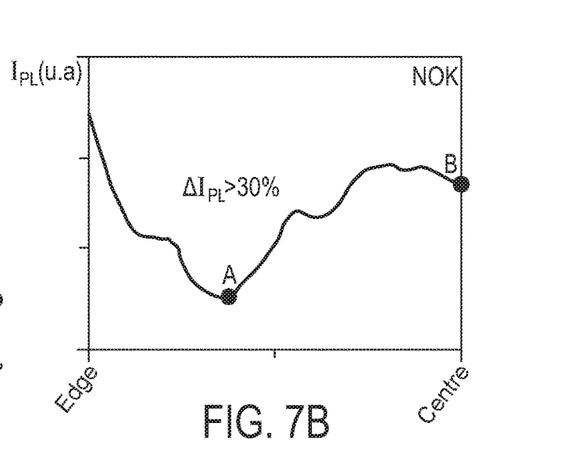

If, conversely, photoluminescence intensity $I_{PL}$ does not decrease continuously ("NO" output in S12), i.e. if it increases between the edge and centre of the wafer as represented in FIGS. 7A and 7B, additional steps are carried out to determine whether the increase of intensity $I_{PL}$ is simply due to a local and low-amplitude increase of the acceptor dopant concentration $N_a$ (and/or a local diminution of the thermal donor concentration), or to a inversion of the doping type caused by a high thermal donor concentration.

Thus, in a step S13, the relative radial variation of the photoluminescence intensity is determined between the minimum of intensity $I_{PL}$ (in the example of FIGS. 7A-7B this is point "A") and intensity $I_{PL}$ measured in the centre of the wafer (point "B").

Relative radial variation $\Delta I_{PL}$ of the photoluminescence intensity between point A (minimum intensity) and point B (central point) is written as follows:

$$\Delta I_{PL} = \frac{I_{PL,B} - I_{PL,A}}{I_{PL,B}}$$

where $I_{PL,A}$ and $I_{PL,B}$ are the values of photoluminescence intensity $I_{PL}$ at points A and B respectively.

Relative radial variation $\Delta I_{PL}$ of the photoluminescence intensity is then compared with a threshold value, for example 30%. The threshold value is chosen such that variations of the photoluminescence intensity caused by natural doping variations are excluded. In p-type CZ silicon, relative variations of acceptor dopant concentration do not generally exceed 30%.

If relative radial variation $\Delta I_{PL}$ of the photoluminescence intensity is less than the 30% threshold ("NO" output in S13), the wafer shows a local increase of acceptor dopant concentration $N_a$, or a local diminution of the thermal donor concentration [DT], but not a inversion of the doping type. The wafer is not then necessarily poor quality. Steps S1 to S6 of the method of FIG. 1 are carried out to check its compatibility, in terms of bulk lifetime, with the cell manufacturing method. If, conversely, relative radial variation $\Delta I_{PL}$ is higher than 30% ("YES" output in S13), this means that the wafer has a doping reversal. This wafer is then discarded in a step S14.

The two sorting methods just described in relation with FIGS. 1 and 6 are particularly advantageous in connection with the manufacture of heterojunction solar cells, to remove wafers which will lead to excessively low efficiencies, and more specifically wafers from the top of the ingot.

Although homojunction solar cells are insensitive to thermal donors, the sorting methods can also be used at the entrance of a homojunction cell production line. Indeed, a high concentration of thermal donors in the silicon wafers in the as-cut state often reveals the presence of other defects, such as oxygen precipitates, which will limit the bulk lifetimes of the charge carriers in the finished cells. Thus, when discarding a wafer with a too low thermal donors-limited lifetime, in accordance with the sorting methods according to the invention, a wafer the bulk lifetime of which will be limited by these other defects will very certainly be discarded. Finally, unlike the sorting method of the prior art, the sorting methods according to the invention do not require that the first step of the homojunction cells manufacturing method (diffusion of the emitter) is accomplished. They will therefore be simpler and more economic to carry out.

When the wafers to be sorted are intended for the manufacture of homojunction solar cells, the bulk lifetime calculated in step S4 is not the true lifetime of the homojunction solar cells, since the thermal donors will have disappeared in the meantime. This does not however negate the benefit and effectiveness of sorting the wafers.

Many variants and modifications of the sorting methods according to the invention will occur to the man skilled in the art. In particular, in step S2 a non-uniform distribution of the dopants, rather than taking a constant dopant concentration $N_a$ or $N_d$ over the wafer, could be considered. For example, a linear variation of dopant concentration $N_a$ or $N_d$ between the edge and centre of the wafer can be introduced. This effect of this will be to improve the calculation accuracy of the thermal donor concentration [DT].

Furthermore, the photoluminescence technique can be used without however acquiring a complete image of each wafer. Indeed, in an embodiment of the sorting method, a single measuring point may suffice (preferentially in the centre). The measurements will then be made point-by-point, with a millimetric laser light spot.

The sorting methods can also be applied to wafers which, after having been delivered in the as-cut state, have been subjected to a step of shaping the surface, such as a texturing step or a step of mechanical and/or chemical polishing.

Whatever their condition (as-cut or with a shaped surface), the wafers to be sorted have no passivation layer, and have not undergone any treatment at a temperature of higher than or equal to 350° C., and preferably no passivation step.

The invention claimed is:

1. A method for sorting wafers obtained by cutting a Czochralski-type monocrystalline silicon ingot, the method being carried out when the wafers are in an as-cut state or in a surface-shaped state and comprising:
   a) measuring a majority free charge carrier concentration in at least one area of each wafer;
   b) calculating a thermal donor concentration in said area of each wafer from the majority free charge carrier concentration;
   c) calculating a thermal donors-limited lifetime of the charge carriers in said area of each wafer, from the thermal donor concentration;
   d) determining a bulk lifetime value of the charge carriers in each wafer, from the thermal donors-limited lifetime;
   e) comparing the bulk lifetime value or a normalised value of the bulk lifetime with a threshold value; and
   f) discarding the wafer when the bulk lifetime value or the normalised value of the bulk lifetime is lower than a threshold value.

2. The method according to claim 1, wherein said area of each wafer is over 5 mm from the edges of the wafer.

3. The method according to claim 1, wherein said area of each wafer is in the centre of the wafer.

4. The method according to claim 1, further comprising calculating the charge carrier lifetime limited by intrinsic recombination mechanisms in said area of each wafer, the bulk lifetime value being further determined from the lifetime limited by the intrinsic recombination mechanisms.

5. The method according to claim 1, wherein the free charge carrier concentration in said area is obtained from a measurement of photoluminescence of the wafer.

6. The method according to claim 5, wherein a thickness of the wafers is less than 580 μm.

7. The method according to claim 1, wherein steps a) to d) are carried out in several areas of each wafer, resulting in a plurality of bulk lifetime values for each wafer, the method further comprising determining, from the plurality of bulk lifetime values, a minimum lifetime value, said minimum value being compared with the threshold value in step e).

8. The method according to claim 1, further comprising, when the wafers contain dopants, measuring the dopant concentration of each wafer, the thermal donor concentration in said area of each wafer being calculated in step b) from the majority free charge carrier concentration and from the dopant concentration.

9. The method according to claim 8, wherein the dopant concentration of each wafer is obtained by measuring the majority free charge carrier concentration in an area in the immediate vicinity of an edge of the wafer.

10. The method according to claim 9, wherein the majority free charge carrier concentration in the area in the immediate vicinity of the edge of the wafer is derived from a measurement of photoluminescence.

11. The method according to claim 1, wherein the wafers are n-type doped.

12. The method according to claim 1, wherein the normalised bulk lifetime value is calculated from the bulk lifetime value obtained in step d) and from a resistivity value of the wafer.

13. A method for sorting wafers obtained by cutting a Czochralski-type monocrystalline silicon ingot containing p-type dopants, the method being carried out when the wafers are in an as-cut state or in a surface-shaped state and comprising:
   making measurements of a parameter representing a majority free charge carrier concentration in each wafer, the measurements being distributed between an edge and the centre of the wafer;
   determining whether said parameter decreases continuously between the edge and centre of each wafer; and
when said parameter decreases continuously:
   a) measuring a majority free charge carrier concentration in at least one area of the wafer;
   b) calculating a thermal donor concentration in said area of the wafer from the majority free charge carrier concentration;
   c) calculating a thermal donors-limited lifetime of the charge carriers in said area of the wafer, from the thermal donor concentration;
   d) determining a bulk lifetime value of the charge carriers in the wafer, from the thermal donors-limited lifetime;
   e) comparing the bulk lifetime value with a first threshold value;
   f) discarding the wafer when the bulk lifetime value is lower than the first threshold value; and
when said parameter does not decrease continuously:
   determining a relative variation of said parameter between the minimum of said parameter and a value of said parameter in the centre of the wafer;
   comparing the relative variation of said parameter with a second threshold value;
   discarding the wafer when the second relative variation of said parameter is higher than the second threshold value;
   carrying out steps a) to f) when the relative variation of said parameter is less than the second threshold value.

* * * * *